US010418511B2

(12) United States Patent
Khan

(10) Patent No.: US 10,418,511 B2
(45) Date of Patent: Sep. 17, 2019

(54) DOUBLE MESA LARGE AREA ALINGABN LED DESIGN FOR DEEP UV AND OTHER APPLICATIONS

(71) Applicant: University of South Carolina, Columbia, SC (US)

(72) Inventor: Asif Khan, Irmo, SC (US)

(73) Assignee: University of South Carolina, Columbia, SC (US)

( * ) Notice: Subject to any disclaimer, the term of this patent is extended or adjusted under 35 U.S.C. 154(b) by 0 days.

(21) Appl. No.: 15/737,631

(22) PCT Filed: Jun. 22, 2016

(86) PCT No.: PCT/US2016/038657
§ 371 (c)(1),
(2) Date: Dec. 18, 2017

(87) PCT Pub. No.: WO2016/209892
PCT Pub. Date: Dec. 29, 2016

(65) Prior Publication Data
US 2018/0175235 A1    Jun. 21, 2018

Related U.S. Application Data

(60) Provisional application No. 62/182,817, filed on Jun. 22, 2015.

(51) Int. Cl.
| H01L 33/00 | (2010.01) |
| H01L 33/32 | (2010.01) |
| H01L 33/06 | (2010.01) |
| H01L 21/02 | (2006.01) |

(52) U.S. Cl.
CPC ............ H01L 33/007 (2013.01); H01L 33/06 (2013.01); H01L 33/32 (2013.01); *H01L 21/0254* (2013.01); *H01L 21/02458* (2013.01)

(58) Field of Classification Search
CPC ........... H01L 21/02458; H01L 21/0254; H01L 33/007; H01L 33/06; H01L 33/32
See application file for complete search history.

(56) References Cited

U.S. PATENT DOCUMENTS

| 2010/0072489 | A1* | 3/2010 | McLaurin | H01L 33/007 257/88 |
| 2011/0294245 | A1* | 12/2011 | Guenard | H01L 21/76251 438/46 |
| 2013/0049140 | A1* | 2/2013 | Asenov | H01L 29/517 257/411 |
| 2013/0056770 | A1* | 3/2013 | Shatalov | H01L 21/0237 257/94 |
| 2014/0110727 | A1 | 4/2014 | Bilenko et al. | |
| 2015/0030046 | A1* | 1/2015 | Aoki | H01L 33/025 372/45.012 |
| 2015/0079769 | A1 | 3/2015 | Kim et al. | |
| 2015/0260659 | A1* | 9/2015 | Chuang | H01L 27/14609 250/370.08 |

* cited by examiner

Primary Examiner — Galina G Yushina
(74) Attorney, Agent, or Firm — Dority & Manning, P.A.

(57) ABSTRACT

Methods are provided for forming AlInGaBN material. The method can include growing an AlInGaBN layer on a substrate; removing a portion of the AlInGaBN layer from the substrate to define a plurality of AlInGaBN islands on the substrate; and growing a highly doped-AlInGaBN layer on each of the AlInGaBN islands.

6 Claims, 5 Drawing Sheets

DOUBLE MESA LARGE AREA ALINGABN LED DESIGN FOR DEEP UV AND OTHER APPLICATIONS

PRIORITY INFORMATION

The present application is the national stage entry of International Patent Application No. PCT/US2016/038657 having a filing date of Jun. 22, 2016, which claims priority to U.S. Provisional Patent Application Ser. No. 62/182,817 titled "Double Mesa Large Area AlInGaBN LED Design for Deep UV and Other Applications" filed on Jun. 22, 2015, both of which are incorporated herein in their entirety by reference thereto.

BACKGROUND

Research interest in the III-Nitride deep ultraviolet (UV) light emission devices has significantly increased over the past few years. Their potential as a replacement for mercury lamps in several bio-medical, air-water purification, and germicidal systems is one of the key drivers for this research. Due to the transparency requirements, the substrate choices for the sub-300 nm AlGaN deep UV surface emission devices, such as light emitting diodes (LEDs), are limited to either single crystal sapphire or AlN. Currently available bulk AlN substrates typically have a strong absorption band for wavelengths around 280 nm which limits their use for ultraviolet subtype C [UVC] LEDs. Sapphire, due to its high UV transparency, is an excellent substrate choice at the deep UV wavelengths. However, its thermal conductivity is only 0.35 $Wcm^{-1}C^{-1}$ as compared to AlN substrates which have a thermal conductivity of 2.85 $Wcm^{-1}C^{-1}$. The lower thermal conductivity results in a high thermal impedance and hence substantially lower DC saturated currents. Simulations show that the thermal impedance can be significantly reduced by incorporating AlN buffer layers with thicknesses in excess of 10 µm over the sapphire substrates. However, when such thick buffer layers are deposited over sapphire using the conventional metalorganic chemical vapor deposition (MOCVD), they crack due to the stress which arises from the thermal expansion coefficient and the lattice mismatch. Moreover, the typical growth rates for AlN MOCVD over sapphire at growth temperatures around 1200° C. are only 0.3-0.5 µm/h. This leads to excessively long times for growing the thick AlN buffers which are required for the low-thermal impedance.

Currently several research groups are actively developing low-defect density AlN substrates to improve the power-lifetime performance of the deep UV LEDs. In the one of the prior art, a new air bridge assisted high-temperature (1500° C.) lateral epitaxy approach to deposit 12 µm thick high-quality AlN layers over SiC substrates as templates for the DUV LEDs. More recently, it has also reported the growth of low dislocation thick AlN layers over grooved SiC substrates for deep UV device epitaxy. Instead of pulsing the metalorganics, a very high growth temperature (1500° C.) with air-bridge assisted CVD growth was used. The 1500° C. growth temperature enabled them to achieve a lateral grow.

Significant progress has also been made in the development of III-Nitride deep ultraviolet (UV) light emitting diodes (LEDs) grown on sapphire substrates using AlGaN multiple quantum well (MQW) active regions. Milliwatt power DUV LEDs for the UVA, UVB and the UVC regions on sapphire substrates with AlGaN multiple quantum well (MQW) active regions have been reported. This progress was largely based on the advancements integrated in the first reported deep UV LEDs demonstrating sub-milliwatt output power. The key to the demonstration of these devices was based on three technical advancements. First, was the use of pulsed atomic layer epitaxy (PALE) to improve the quality of the buffer AlN layer. PALE deposited $Al_xGa_{1-x}N/Al_yGa_{1-y}N$ short-period superlattices were also inserted between the buffer AlN and the n-contact AlGaN layer to control the thin-film stress, thereby mitigating epilayer cracking. Finally, a p-GaN/p-AlGaN heterojunction contact layer was used to improve hole injection.

In these first generation UVLEDs, under a cw-pump current of 20 mA, the average output powers for state-of-the-art 300 µm² UVC LEDs are about 1 mW. Due to the poor thermal conductivity of the sapphire substrates, these powers quickly saturate at pump currents around 40-50 mA.

Although the first generation deep UV light emitting devices represent a potential solid state replacement source for more traditional mercury based lamps, these devices suffer from premature performance degradation. Under cw-bias conditions, at 20 mA pump current, the on-wafer device lifetimes (50% power reduction) are only about 50-100 h. Their output powers exhibited a fast reduction (~10% reduction in output power after several hours) followed by a slower decrease (~50% reduction in output power after 10-100 hours) during on wafer testing. Flip-chip packaging of these devices with heat sinks increased the lifetime to approximately 1000 hours for a pump current density of 200 $A/cm^2$. These studies have shown the initial fast decrease to be both current and temperature dependent and this decrease is related to a device burn-in that creates small, localized alternative current paths, reducing the diode efficiency. At this time, it is unclear whether this phenomenon is related to surface states on the mesa sidewalls, or localized regions within the diode active area. It has also been demonstrated that the slow degradation is strongly dependent on the junction temperature which increases with applied bias (joule heating) resulting in the increase and activation of the non-radiative recombination centers. This degradation is a very strong function of the cw-pump current density Typically, the AlGaN layers for deep UV LEDs with approximately 50% Al-composition can only be grown with a maximum thickness of around 2 µm and doping of $(1-2) \times 10^{18}$ $cm^{-3}$. Beyond these values the layers develop excessive stress and hence cracking results making them unsuited for LED fabrication. This presents a key issue: the inability to grow AlInGaBN layers with thickness and doping levels allowing a small spread resistance.

Thus, a need exists for simplified and efficient methods for growth of AlInGaBN materials.

SUMMARY

Objects and advantages of the invention will be set forth in part in the following description, or may be obvious from the description, or may be learned through practice of the invention.

Methods are generally provided for forming AlInGaBN material. In one embodiment, the method includes growing an AlInGaBN layer on a substrate; removing a portion of the AlInGaBN layer from the substrate to define a plurality of AlInGaBN islands on the substrate; and growing a highly doped-AlInGaBN layer on each of the AlInGaBN islands.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which:

FIG. 3a shows a cross-sectional view of an exemplary highly doped-AlInGaBN layer on the AlInGaBN island of FIG. 2a.

DEFINITIONS

Figure 1:
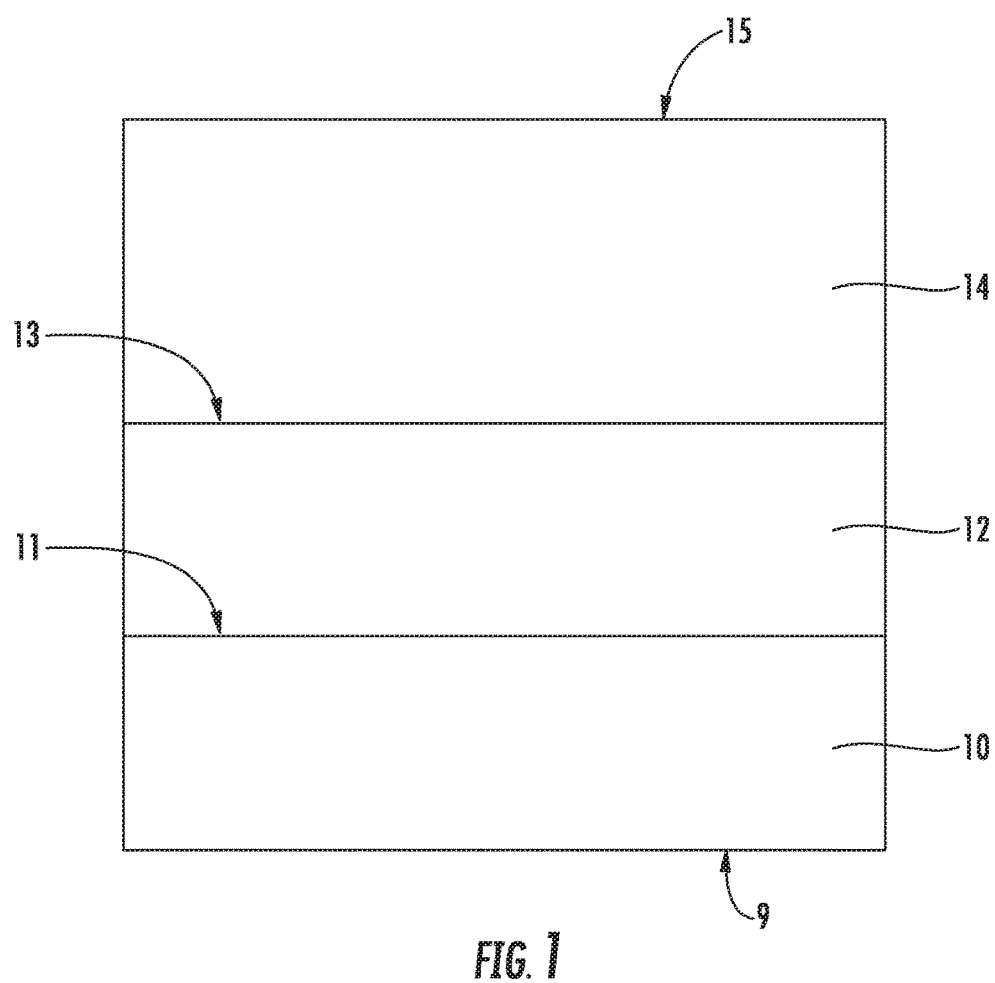
FIG. 1 shows a cross-sectional view of an exemplary AlInGaBN layer formed on a substrate.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

In the present disclosure, when a layer is being described as "on" or "over" another layer or substrate, it is to be understood that the layers can either be directly contacting each other or have another layer or feature between the layers, unless expressly stated to the contrary. Thus, these terms are simply describing the relative position of the layers to each other and do not necessarily mean "on top of" since the relative position above or below depends upon the orientation of the device to the viewer.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Generally speaking, the present invention relates to the development of highly stable deep ultra-violet light emitting diodes (LEDs) and improving the power-lifetime performance of UV light emitting diodes (LEDs) for commercial applications. More specifically, a new Double Mesa Large Area LED Design is generally provided for avoiding the current crowding issue that limits the maximum area of deep UV LEDs. The methods generally described herein avoid the growth limitations previously seen by growing the relevant active layers in a selective area.

The LEDs of the present invention can be formed by growing a group-III nitride template on a UV-light transparent substrate (e.g., a sapphire, aluminum gallium nitride substrate) and then flip-chip mounting the LED electrodes such that the UV light is emitted through the UV-light transparent substrate. "Group III nitride" refers to those semiconducting compounds formed between elements in Group III of the periodic table and nitrogen. More preferably the Group III element is selected from the group consisting of aluminum (Al), gallium (Ga), and indium (In). As is well understood in the art, the Group III elements can combine with nitrogen to form binary compounds (e.g., GaN, AlN and InN), ternary compounds (e.g., AlGaN, AlInN, and GaInN), and quaternary compounds (i.e., AlInGaN). However, the inclusion of indium in layers of the LED can cause a shift in wavelength of the emitted light to the visible and out of the ultraviolet. Thus, in one embodiment, the nitride layers of the LED of the present invention can be substantially free of indium.

One exemplary embodiment is schematically shown in FIGS. 1-3. FIG. 1 shows an exemplary substrate 10 defining a first surface 11 and an opposite surface 9. The substrate 10 can be any suitable substrate for hosting a LED, including but not limited to sapphire, aluminum gallium nitride, silicon carbide, boron nitride, silicon, etc.

A buffer layer 12 is optionally positioned on the first surface 11 of the substrate 10. In turn, the buffer layer 12 defines a buffer surface 13. In certain embodiments, the buffer layer 12 includes an AlN/AlInGaBN superlattice template 22 or an AlN—AlN/AlInGaBN superlattice template 22.

An AlInGaBN layer 14 is also formed over the substrate 10. In the shown embodiment, the AlInGaBN layer 14 is formed on the buffer surface 13 of the buffer layer 12 such that the buffer layer 12 is positioned between the substrate 10 and the AlInGaBN layer 14. However, in other embodiments, the AlInGaBN layer 14 can be positioned directly on the substrate 10.

The AlInGaBN layer 14 is a $n^+$-AlInGaBN layer in one particular embodiment, This layer 14 can also be comprised of a superlattice that includes n+AlInGaBN.

The AlInGaBN layer 14 is grown on the substrate 10 (i.e., the buffer layer 12 when present) using any suitable technique, including but not limited to, metalorganic chemical vapor deposition (MOCVD), hydride vapor phase epitaxy (HVPE), molecular beam epitaxy (MBE), metalorganic hydride vapor phase epitaxy (MOHVPE), pulsed atomic layer epitaxy (PALE) growth technique, pulsed lateral overgrowth techniques (PLOG) (useful for growth of a group III nitride epilayer on a patterned wafer), or any combination of any of the deposition methods.

Figure 2A:
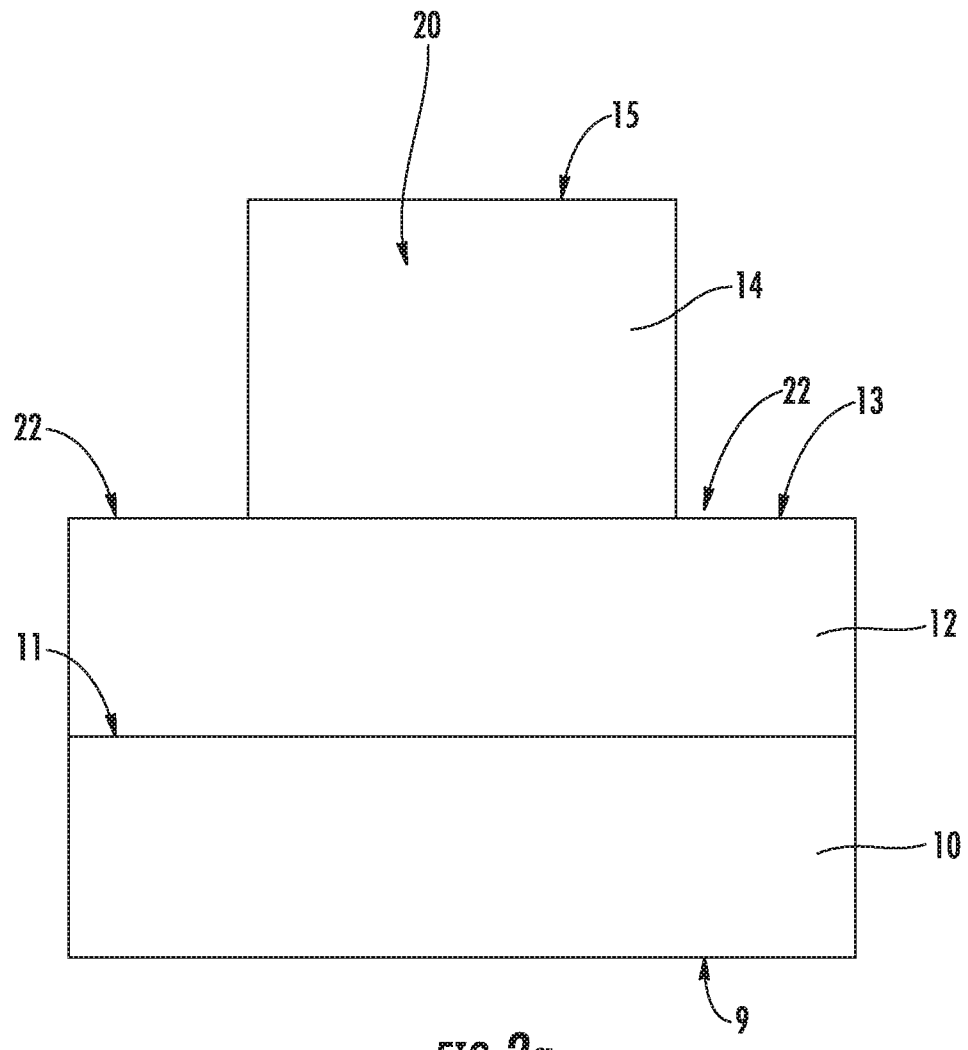
FIG. 2a shows a cross-sectional view of an exemplary AlInGaBN island on a first selective area of a substrate.
Figure 2B:
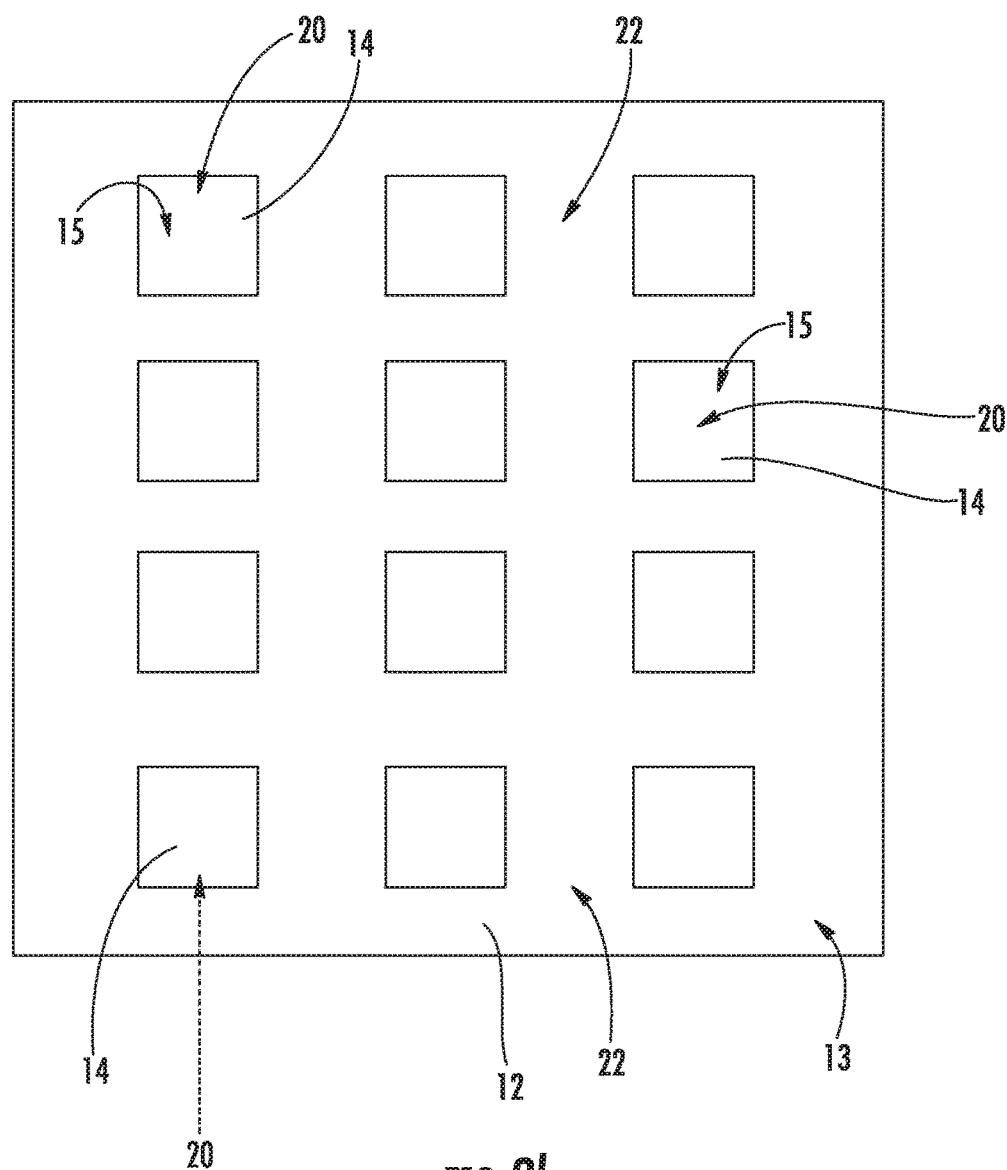
FIG. 2b shows a top-down view of an exemplary AlInGaBN layer, such as in FIG. 2a, with a plurality of AlInGaBN islands on the substrate.

After the AlInGaBN layer 14 is formed, a portion of the AlInGaBN layer 14 is removed such that a plurality of AlInGaBN islands 20 are defined over the substrate 10, as shown in FIGS. 2a and 2b. Thus, the buffer surface 13 is exposed in the areas where the AlInGaBN layer 14 is removed. In one embodiment, the AlInGaBN islands 20 have at least one dimension with a size ranging from about 0.5 mm to about 2 mm (e.g., about 0.5×0.5 mm to about 2×2 mm if square), though larger islands 20 could be formed if desired.

In one embodiment, the portion of the AlInGaBN layer 14 is removed utilizing a $SiO_2$ masking process. The area not to be removed is covered by a masking material (e.g., $SiO_2$) that has a reactive-ion etch rate less than AlInBGaN. Then, a reactive ion-etching process is used to remove the AlInBGaN layer from uncovered and exposed areas.

Figure 3A:
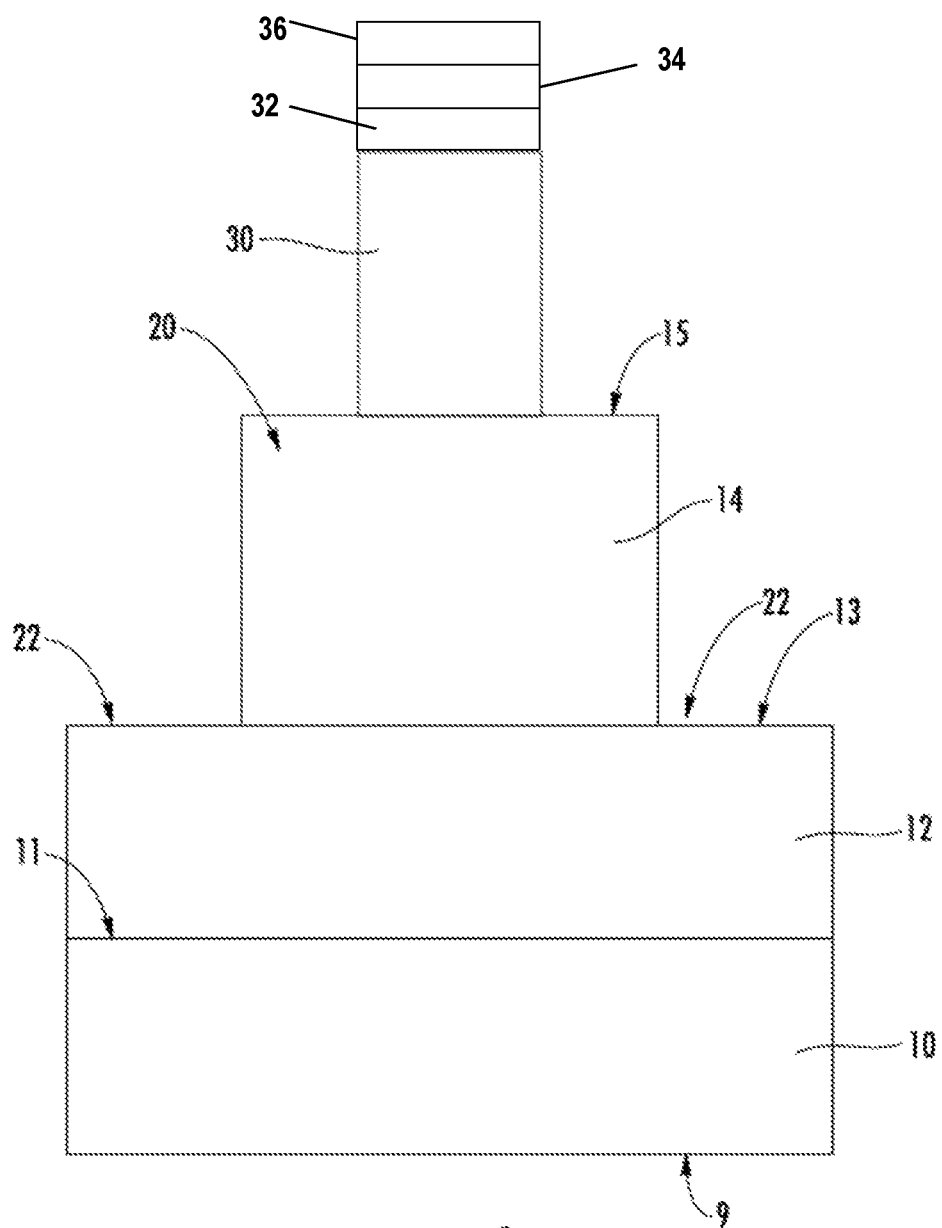
Figure 3B:
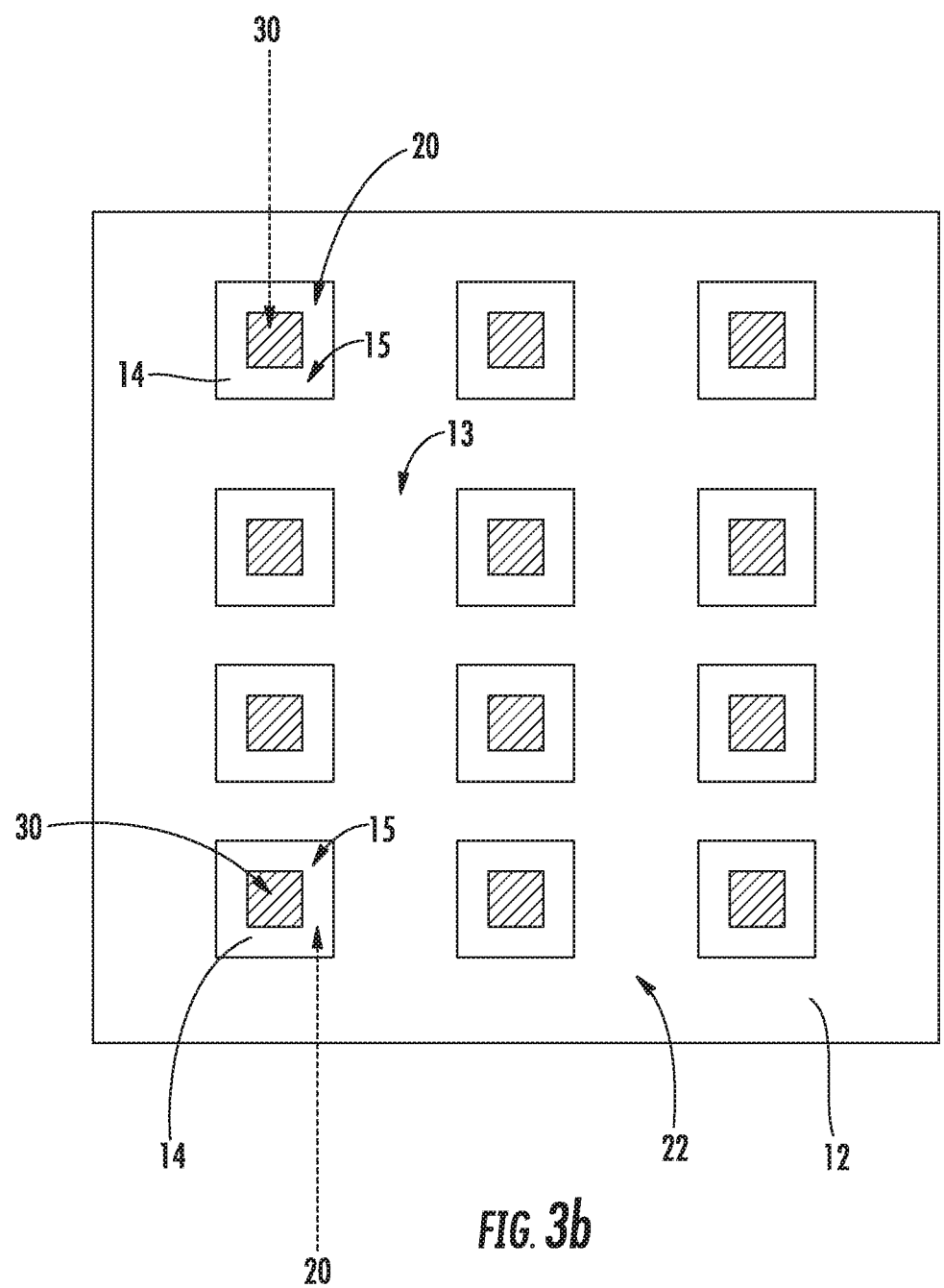
FIG. 3b shows a top-down view of an exemplary highly doped-AlInGaBN layer on each of the AlInGaBN islands of FIG. 2b.

As shown in FIGS. 3a and 3b, a highly doped $n^+$-AlInGaBN layer 30 is then grown on the surface 15 of the AlInGaBN islands 20 to serve as $n^+$-templates for subsequent growth of the MQW active region 32 and the p-Electron block 34 and the p-AlGaN-p-GaN layer 36. The etched portions can also be covered with $SiO_2$ by using a masking process followed by sputtering or e-beam evaporation of $SiO_2$ or any other chemical process.

The doped $n^+$-AlInGaBN layer 30 generally includes a $n^+$-AlInGaBN material doped with Si, Ge, $O_2$, or other n-type dopants. The doping concentrations can vary from about $1\times10^{16}/cm^3$ to about $1\times10^{20}/cm^3$.

The n+-AlInBGaN layer thickness can vary from 0.5 µm to 5 µm. Subsequently, the MQW region 32, the p-Electron block layer 34 and the p-AlGaN-p-GaN layer 36 are then deposited using MOCVD.

It is to be understood that when reciting nitrides, a sum of group III elements in any nitride composition shall be greater than or equal to zero and less than or equal to 1, e.g. AlInGaBN is understood as $Al_xIn_yGa_zB_{1-x-y-z}N$, where $0 \leq x+y+z \leq 1$, and AlGaN is understood as $Al_xGa_{1-x}N$, where $0 \leq x \leq 1$.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A method of forming an $Al_xIn_yGa_zB_{1-x-y-z}N$ ($0 \leq x+y+z \leq 1$) material having a double mesa structure, the method comprising:

growing an $Al_xIn_yGa_zB_{1-x-y-z}N$ ($0 \leq x+y+z \leq 1$) layer on a substrate;

removing a portion of the $Al_xIn_yGa_zB_{1-x-y-z}N$ ($0 \leq x+y+z \leq 1$) layer to define a plurality of $Al_xIn_yGa_zB_{1-x-y-z}N$ ($0 \leq x+y+z \leq 1$) islands on the substrate, wherein each of the $Al_xIn_yGa_zB_{1-x-y-z}N$ ($0 \leq x+y+z \leq 1$) islands has an area between 0.5 millimeters by 0.5 millimeters and 2 millimeters by 2 millimeters; and growing an n-doped $Al_xIn_yGa_zB_{1-x-y-z}N$ ($0 \leq x+y+z \leq 1$) layer on each of the $Al_xIn_yGa_zB_{1-x-y-z}N$ ($0 \leq x+y+z \leq 1$) islands, wherein the n-doped $Al_xIn_yGa_zB_{1-x-y-z}N$ ($0 \leq x+y+z \leq 1$) layer grown on each of the $Al_xIn_yGa_zB_{1-x-y-z}N$ ($0 \leq x+y+z \leq 1$) islands has an area that is less than the area of each of the $Al_xIn_yGa_zB_{1-x-y-z}N$ ($0 \leq x+y+z \leq 1$) islands.

2. The method as in claim 1, further comprising:

growing a multiple quantum well (MQW) active region on the n-doped $Al_xIn_yGa_zB_{1-x-y-z}N$ ($0 \leq x+y+z \leq 1$) layer.

3. The method as in claim 2, further comprising:

forming a p-Electron block on the MQW active region.

4. The method as in claim 3, further comprising:

forming a p-$Al_xGa_{1-x}N$ ($0 \leq x \leq 1$)-p-GaN layer on the p-Electron block.

5. The method of claim 1, wherein a buffer layer is positioned between the $Al_xIn_yGa_zB_{1-x-y-z}N$ ($0 \leq x+y+z \leq 1$) layer and the substrate such that the $Al_xIn_yGa_zB_{1-x-y-z}N$ ($0 \leq x+y+z \leq 1$) layer is grown on the buffer layer.

6. The method of claim 1, wherein the substrate is a sapphire substrate.

* * * * *